(12) United States Patent
Wada et al.

(10) Patent No.: US 6,311,203 B1
(45) Date of Patent: Oct. 30, 2001

(54) MULTIPLIER, AND FIXED COEFFICIENT FIR DIGITAL FILTER HAVING PLURAL MULTIPLIERS

(75) Inventors: Yasushi Wada; Shuji Murakami, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/203,373

(22) Filed: Dec. 2, 1998

(30) Foreign Application Priority Data

Jul. 27, 1998 (JP) .................................................. 10-210835

(51) Int. Cl.$^7$ .............................. G06F 7/52; G06F 17/10
(52) U.S. Cl. ............................................. 708/625; 708/319
(58) Field of Search .................................... 708/625, 620, 708/319

(56) References Cited

U.S. PATENT DOCUMENTS

| | | | |
|---|---|---|---|
| 5,159,567 | * 10/1992 | Gobert | 708/625 |
| 5,243,552 | * 9/1993 | Asakura | 708/625 |
| 5,313,414 | * 5/1994 | Yang et al. | 708/625 |
| 5,815,422 | * 9/1998 | Dockser | 708/620 |
| 5,841,684 | * 11/1998 | Dockser | 708/620 |
| 6,141,674 | * 10/2000 | Unkrich et al. | 708/319 |

* cited by examiner

*Primary Examiner*—David H. Malzahn
(74) *Attorney, Agent, or Firm*—McDermott, Will & Emery

(57) ABSTRACT

A multiplication device for performing a multiplication operation on a multiplicand X and two fixed coefficients C1 and C2 where C1>C2. The multiplication device comprises a multiplier for multiplying multiplicand X and the average CA of the two fixed coefficients C1 and C2; a shift register for obtaining a sum of the multiplicand X data after being shifted up according to a position of a "1" bit in bit data where the bit data is the remainder coefficient obtained by subtracting average CA from fixed coefficient C1; and a selector for selecting a product obtained for one of the fixed coefficients C1 and C2. When the fixed coefficient C1 is selected, the selector outputs the sum of the product returned by the multiplier and the accumulated value obtained by the shift register; when fixed coefficient C2 is selected, the selector outputs the difference of the product returned by the multiplier minus the accumulated value obtained by the shift register. A fixed coefficient FIR digital filter having a plurality of multiplication devices above-mentioned is also disclosed.

13 Claims, 7 Drawing Sheets

MULTIPLIER, AND FIXED COEFFICIENT FIR DIGITAL FILTER HAVING PLURAL MULTIPLIERS

BACKGROUND OF THE INVENTION

1. Field of the Invention

The present invention relates to a multiplication device for performing multiplication on a multiplicand and plural fixed coefficients and for subsequently outputting the product obtained for a selected one of the fixed coefficients, and also to a fixed coefficient type finite impulse response (FIR) digital filter having a plurality of such multipliers.

2. Description of the Related Art

A multiplication device used in a fixed coefficient FIR digital filter is well known which performs multiplication on a multiplicand and plural fixed coefficients find then outputs the result (product) obtained for a selected one of the fixed coefficients.

FIG. 11 shows the prior art multiplication device 500 for multiplying a common multiplicand X by two fixed coefficients C1 and C2 and then outputting one of the two results, that is, the result obtained for a selected one of the coefficients. As shown in FIG. 11, this multiplication device 500 has two multipliers 50 and 51. One multiplier 50 multiplies the multiplicand X by a fixed coefficient C1 and outputs the result to a selector 52. The other multiplier 51 multiplies the multiplicand X by another fixed coefficient C2 and likewise outputs the result to the selector 52. The selector 52 selects one of the multipliers 50 and 51 based on a selection control signal, which is set according to the fixed coefficient to be used, and passes the result from the selected multiplier 50 or 51 as the product of the multiplication.

The prior art multiplication device 500 as thus described requires the same number of multipliers as the fixed coefficients to be dealt with thereby. An obvious problem with this configuration is that the size of the multiplication device necessarily increases as the number of fixed coefficients increases.

SUMMARY OF THE INVENTION

It is therefore an object of the present invention to provide a multiplication device having a simplified configuration for performing multiplication on a common multiplicand and two fixed coefficients and then outputting the result of the multiplication for a selected one of the coefficients.

It is a further object of the present invention to provide a fixed coefficient taipe FIR digital filter comprising a plurality of such multiplication devices.

A multiplication device designed to accomplish the foregoing objects of the present invention multiples a multiplicand X and two fixed coefficients C1 and C2, where C1>C2, and outputs the result of the multiplication for a selected one of the fixed coefficient C1 or C2. This multiplication device comprises a multiplier for multiplying the multiplicand X and the average CA of the fixed coefficients C1 and C2; a shift register unit comprising one or more shift registers for shifting the multiplicand X up according to the position of a "1" bit in a remainder coefficient, which is obtained by subtracting the average CA from the fixed coefficient C1, and an adder for obtaining the arithmetic sum of bit shifted data output from the one or more shift registers; and a selection means for selecting one of the fixed coefficients C1 or C2 based or a specific control signal.

When the fixed coefficient C1 is selected, the selection means outputs the sum of the product from the multiplier and the arithmetic sum obtained by the shift register unit. When the fixed coefficient C2 is selected, the selection means outputs the difference between the product from the multiplier minus the arithmetic sum obtained by the shift register unit.

By thus using a multiplier and a shift register unit that is simpler than the multiplier in contrast to the prior art device that requires the use of the two multiplies, the multiplication device according to the present invention can be made compact and at lower cost.

If in place of the multiplier a shift register unit comprising one or more shift registers for shifting the multiplicand X up according to the position of a "1" bit in the average CA, and an adder for obtaining the sum of the shifted data output from the one or more shift registers are used, the multiplication device of the invention can be made on an even smaller scale and lower cost.

A fixed coefficient FIR digital filter having a plurality of multiplication devices according to the invention is also provided. This digital filter comprises a shift register for shifting the multiplicand X up according to the position of a "1" bit in bit data common to two or more remainder coefficients used by the plurality of multiplication devices, and a shift register for shifting the multiplicand K up according to a position of a "1" bit in bit data obtained by subtracting said common bit data from a remainder coefficient. Redundant shift registers can thus be eliminated from the plural shift register units, and the digital filter cain thus be reduced in scale.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

DESCRIPTION OF THE PREFERRED EMBODIMENTS

Embodiment 1

(1-1) Princile of Multiplication Device

A multiplication device 100 according to a first embodiment of the present invention is described below with reference to FIG. 1. This multiplication device 100 multiplies a multiplicand X with two fixed coefficients C1 (for instance, =10011010) and C2 (for instance, =01110010) to give the two multiplication results, one of which is subsequently outputted for one of the fixed coefficients C1 or C2 that is selected according to a selection control signal.

The multiplication performed by this multiplication device 100 will first be described below.

If a common coefficient A is the value 00010010, the fixed coefficient C1 is expressed as common coefficient A (=00010010) plus remainder coefficient B (=10001000), and, on the other hand, the fixed coefficient C2 is expressed as common coefficient A (=00010010) plus remainder coefficient C (=01100000). In this example, the average of the fixed coefficients C1 and C2 is thus expressed as follows:

$$(C1 + C2)/2 = (2A + B + C)/2$$
$$= A + (B + C)/2.$$

Hereinbelow, the average of the fixed coefficients C1 and C2 is referred to as average common coefficient CA.

The fixed coefficient C1 can therefore be expressed as follows using the average common coefficient CA:

$$C1 = A + B$$
$$= A + (B + C)/2 + (B - C)/2$$
$$= CA + (B - C)/2.$$

Likewise, the fixed coefficient C2 can be expressed as follows using the average common coefficient CA:

$$C2 = A + C$$
$$= A + (B + C)/2 + (B - C)/2$$
$$= CA - (B - C)/2.$$

Hereinbelow, the value (B−C)/2 is treated as the remainder coefficient. The product of the multiplicand X and the fixed coefficient C1 is thus the sun of the product of the multiplicand X and the average common coefficient CA plus the product of the multiplicand X and the remainder coefficient (B−C)/2. Likewise, the product of the multiplicand X and the fixed coefficient C2 is the difference between the product of the multiplicand X and the average common coefficient CA and the product of the multiplicand X and the remainder coefficient (B−C)/2.

Using the average common coefficient CA and the remainder coefficient (B−C)/2 thus defined, the multiplication device 100 performs multiplication on the multiplicand X and the fixed coefficients C1 and C2 and then outputs the product obtained for the selected fixed coefficient C1 or C2.

Figure 1:
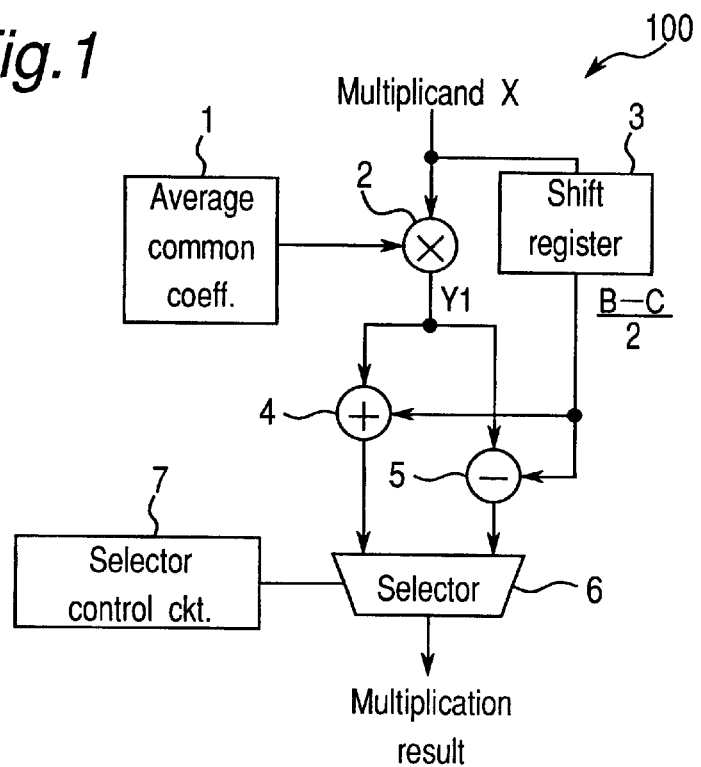
FIG. 1 is a diagram of a multiplication device according to a first embodiment of the present invention.

FIG. 1 is a typical diagram of the multiplication device 100 according to this preferred embodiment. An average common coefficient CA output circuit 1 calculates the average of the fixed coefficients C1 and C2, that is, calculates (C1+C2)/2, and supplies the result (=10000110) to a multiplier 2 as the average common coefficient CA.

It will be further obvious to one with ordinary skill in the art that instead of calculating the average common coefficient CA using this average common coefficient CA output circuit 1, this average common coefficient CA can be supplied directly from some external source to the multiplier 2, or the average CA can be obtained by software-implemented operation and supplied to the multiplier 2.

The multiplier 2 then multiplies the multiplicand X and the average common coefficient CA and outputs the product as an intermediate product Y1 to an adder 4 and a subtracter 5.

A shift register 3 multiplies the multiplicand X and the remainder coefficient (B−C)/2 and likewise supplies the product as a remainder coefficient product Y2 to the adder 4 and the subtracter 5.

A selector control circuit 7 outputs a specific selection control signal corresponding to the value of the fixed coefficient to be used. A selector 6 then selects the output from either the adder 4 or the subtracter 5 based on the selection control signal applied thereto from the selector control circuit 7, and passes in output from the selected adder 4 or subtracter 5 as the product of the multiplicand X and the fixed coefficient.

(1-2) Multiplier Configuration

Figure 2:
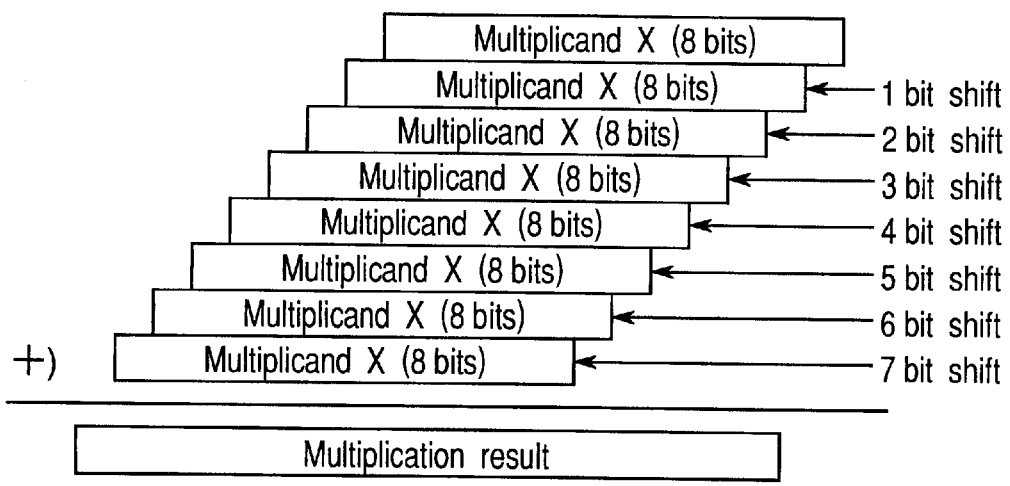
FIG. 2 is a diagram used to explain the operation of the multiplier.

As shown in FIG. 2, the multiplier 2 of the multiplication device 100 shown in FIG. 1 is so designed as to shift the multiplicand X one bit, then sequentially repeat this process to generate seven bit-shifted values, and accumulate the bits of the multiplicand X and seven shifted values corresponding to the positions of the "1" bits in the average common coefficient CA.

Figure 3:
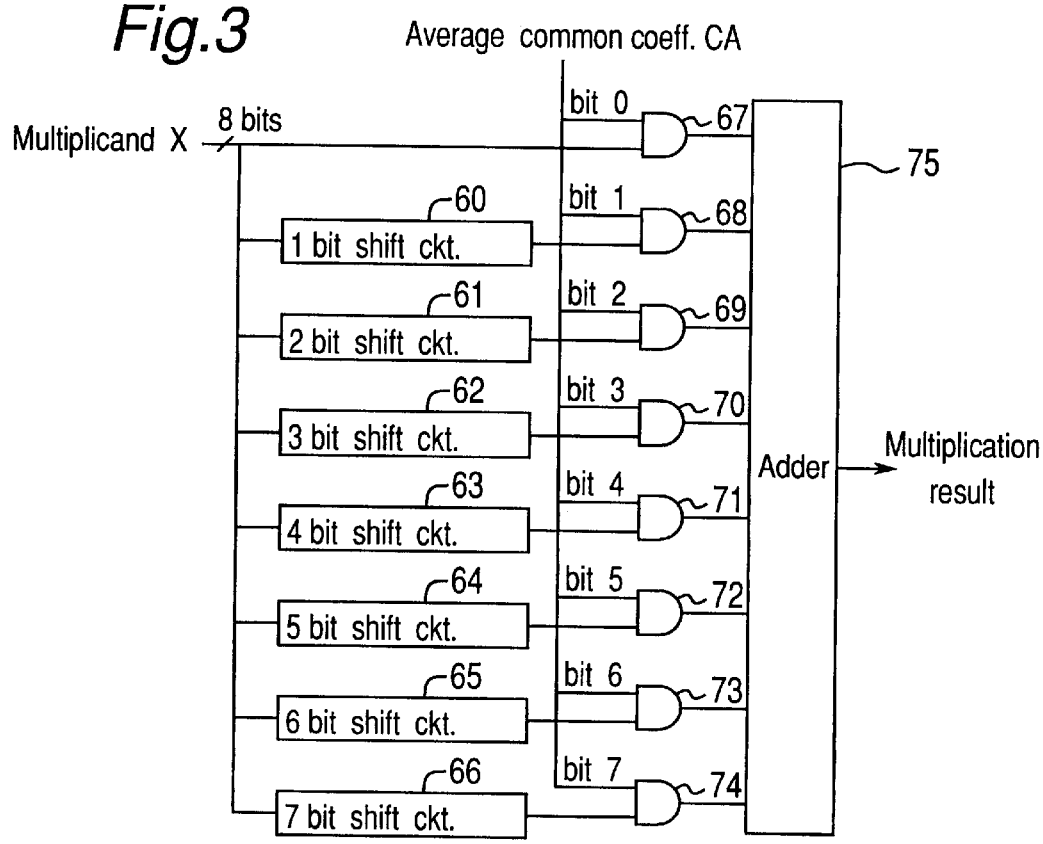
FIG. 3 shows the configuration of a multiplier.

As shown in FIG. 3, the multiplier 2 of the multiplication device 100 shown in FIG. 1 comprises eight two-input AND gates 67 to 74, a 1-bit shift register 60, a 2-bit shift register 61, a 3-bit shift register 62, a 4-bit shift register 63, a 5-bit shift register 64, a 6-bit shift register 65, and a 7-bit shift register 66.

The multiplicand X is applied to each of the shift registers 60 to 66, and to one of the inputs to the AND gate 67. The 1-bit shift register 60 shifts the multiplicand X by one bit, and applies the result to one input of the AND gate 68. The 2-bit shift register 61 shifts the multiplicand X by two bits, and applies the result to one input of the AND gate 69. The 3-bit shift register 62 shifts the multiplicand X by three bits, and applies the result to one input of the AND gate 70. The 4-bit shift register 63 shifts the multiplicand X by four bits, and applies the result to one input of the AND gate 71. The 5-bit shift register 64 shifts the multiplicand X by five bits, and applies the result to one input of the AND gate 72. The 6-bit shift register 65 shifts the multiplicand X by six bits, and applies the result to one input of the AND gate 73. The 7-bit shift register 61 shifts the multiplicand X by seven bits, and applies the result to one input of the AND gate 74.

To the other input terminal of the two-input AND gates 67 to 74 is applied, respectively, bit 0, 1, 2, 3, 4, 5, 6, or 7 of the average common coefficient CA. If the corresponding bit from the average common coefficient CA applied to the AND gate 67 to 74 is 1, the value applied to that gate from the corresponding shift register will be output; if the corresponding bit from the average common coefficient CA is 0, the gate outputs 00000000. An adder 75 then obtains the sum of the data from the AND gates 67 to 74, and outputs the sum as the product of the multiplier 2.

(1-3) Shift Register Configuration

Figure 4:
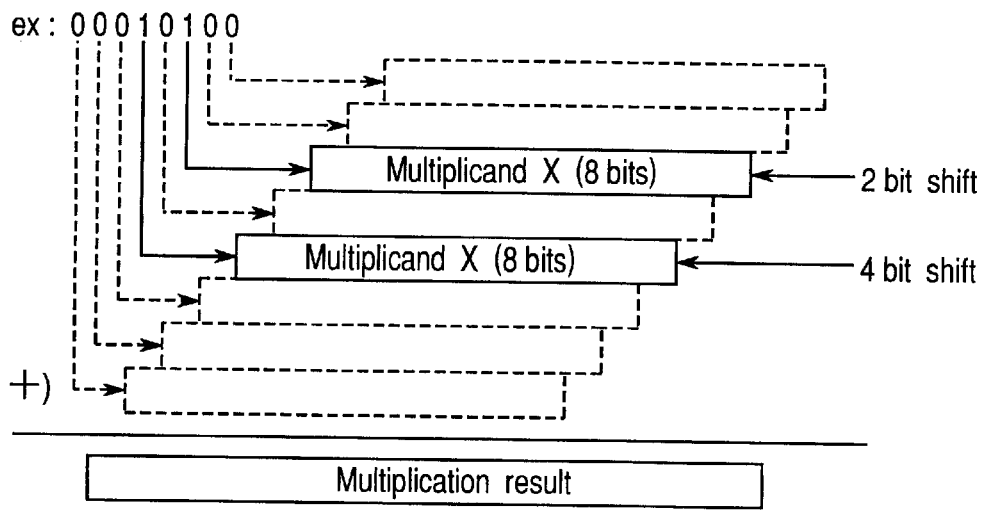
FIG. 4 is a diagram used to explain the operation of the shift register.
Figure 5:
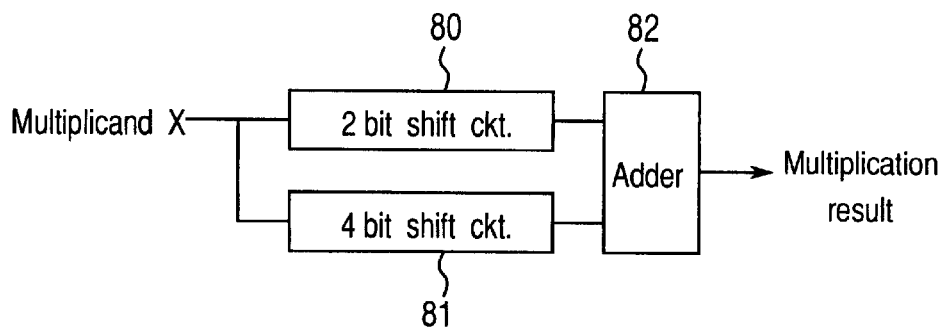
FIG. 5 shows the configuration of a shift register.

The multiplication performed by the shift register 3 of the multiplication device 100 shown in FIG. 1 is shown in FIG. 4, and the configuration of the shift register 3 is shown in FIG. 5. The shift register 3 comprises a 2-bit shift register 80, a 4-bit shift register 81, and an adder 82. The 2-bit shift register 80 and the 4-bit shift register 81 shift the multiplicand X by two and four bits, respectively, according to the position of the "1" bits in the remainder coefficient (B−C)/2(=00010100), that is, bit 2 and bit 4.

As can readily be understood from comparison of FIG. 3 showing the configuration of the multiplier 2 with FIG. 5 showing the configuration of the shift register 3, the shift register 3 is much simpler in structure than the multiplier 2.

It will therefore also be obvious that the scale and cost of the multiplication device that utilizes one complex multiplier 2 to multiply a multiplicand K and one fixed coefficient C1, and another complex multiplier 2 to multiply a multiplicand X and a second fixed coefficient C2, are greater than the scale and cost of the multiplication device 100 that utilizes only one multiplier 2 and a simple shift register 3 to accomplish the same task. It will therefore also be obvious that the scale and cost of a multiplication device 100 according to the present invention can be reduced by using the multiplier 2 and the simple shift register 3 to multiply the multiplicand X and the two fixed coefficients C1 and C2.

It should be noted that the multiplier 2 of the multiplication device 100 according to the present embodiment can be constructed similarly to the shift register 3, that is, using three shift registers to shift the multiplicand X according to the location of the "1" bits of the average common coefficient CA (=10000110), and an adder to obtain the sum of the data output from the shift registers. By thus constituting the multiplier 2, the multiplication device 100 of the invention can be further simplified and reduced in cost.

It will also be obvious that this applies to a multiplication device 200 according to the second embodiment of the invention, and to the first to third multiplying circuits used in a digital filter 300 according to a third embodiment of the invention, as described further below.

(1-4) Multiplication Process

Figure 6:
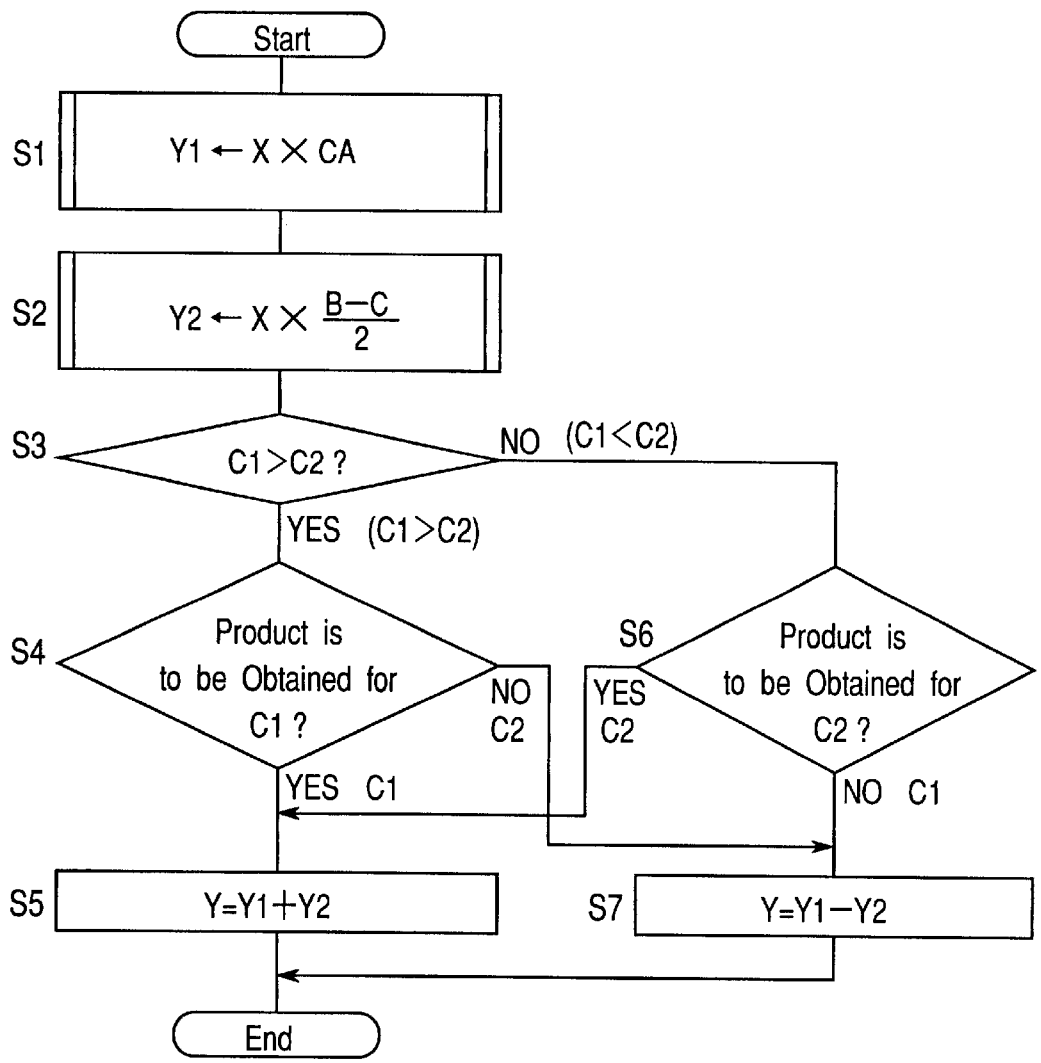
FIG. 6 is a flow chart showing the sequence of operation performed by the multiplication device shown in FIG. 1.

FIG. 6 is a flow chart of the multiplication process performed by the multiplication device 100 according to the first embodiment of the present invention when implemented as a software application.

This process starts by multiplying the multiplicand X and the average common coefficient CA to obtain the intermediate product Y1 (step S1). Next, the multiplicand X and the remainder coefficient (B−C)/2 are multiplied to obtain the remainder coefficient product Y2 (step S2).

If the fixed coefficient C1 is greater than the fixed coefficient C2 (step S3=yes), and the product is to be obtained for the fixed coefficient C1 (step S4=ages), the sum of the intermediate product Y1 and the remainder coefficient product Y2 is output as a product Y (step S5).

However, if the fixed coefficient C1 is greater than the fixed coefficient C2 (step S3=yes), and the product is to be obtained for the fixed coefficient C2 (step S4=no), the difference between the intermediate product Y1 and the remainder coefficient product Y2 is output as a product Y (step S7).

If the fixed coefficient C1 is less than C2 (step S3=no), and the product is to be obtained for the fixed coefficient C2 (step S6=yes), the sum of the intermediate product Y1 and the remainder coefficient product Y2 is output as a product Y (step S5).

If the fixed coefficient C1 is less than C2 (step S3=no), and the product is to be obtained for the fixed coefficient C1 (step S6=no), the difference between the intermediate product Y1 and the remainder coefficient product Y2 is output as a product Y (step S7).

Figure 7:
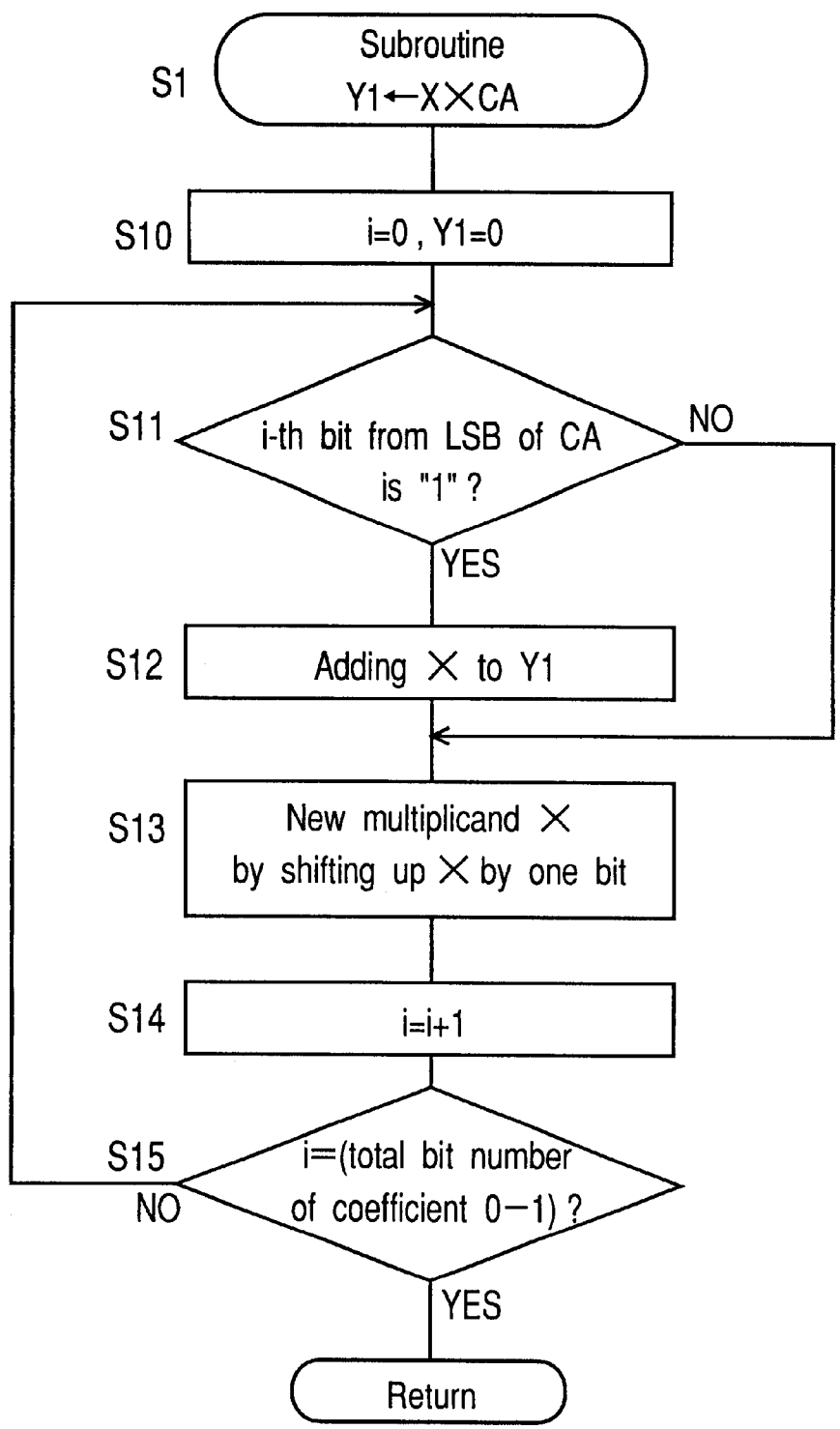
FIG. 7 is a flow chart showing the sequence of operation performed by a multiplier of the multiplication device shown in FIG. 1.

FIG. 7 is a flow chart of the process for multiplying the multiplicand X and the average common coefficient CA that is performed at step S1 in FIG. 6.

This multiplication process starts by initializing a variable i and the value of the intermediate product Y1 to 0 (step S10). Decision step S11 then determines whether the bit i from the least-significant bit (LSB) of the average common coefficient CA is "1". If this decision step S11 returns yes, the multiplicand X is added to the intermediate product Y1 (step S12). However, if this decision step returns no (bit from the LSB is "0"), step S12 is skipped, and the multiplicand X is shifted up one bit to obtain a new multiplicand X (step S13). The variable i is then incremented (step S14), and it is next determined whether the variable i is equal to the bit length of the average common coefficient CA (step S15). If this decision step S15 returns no, the procedure loops back to decision step S11 and repeats to step S15. When the decision step 15 returns yes, that is, the variable i is equal to or greater than the bit length of the average common coefficient CA and every bit has been tested, the multiplication process terminates and the procedure returns to the main process.

Figure 8:
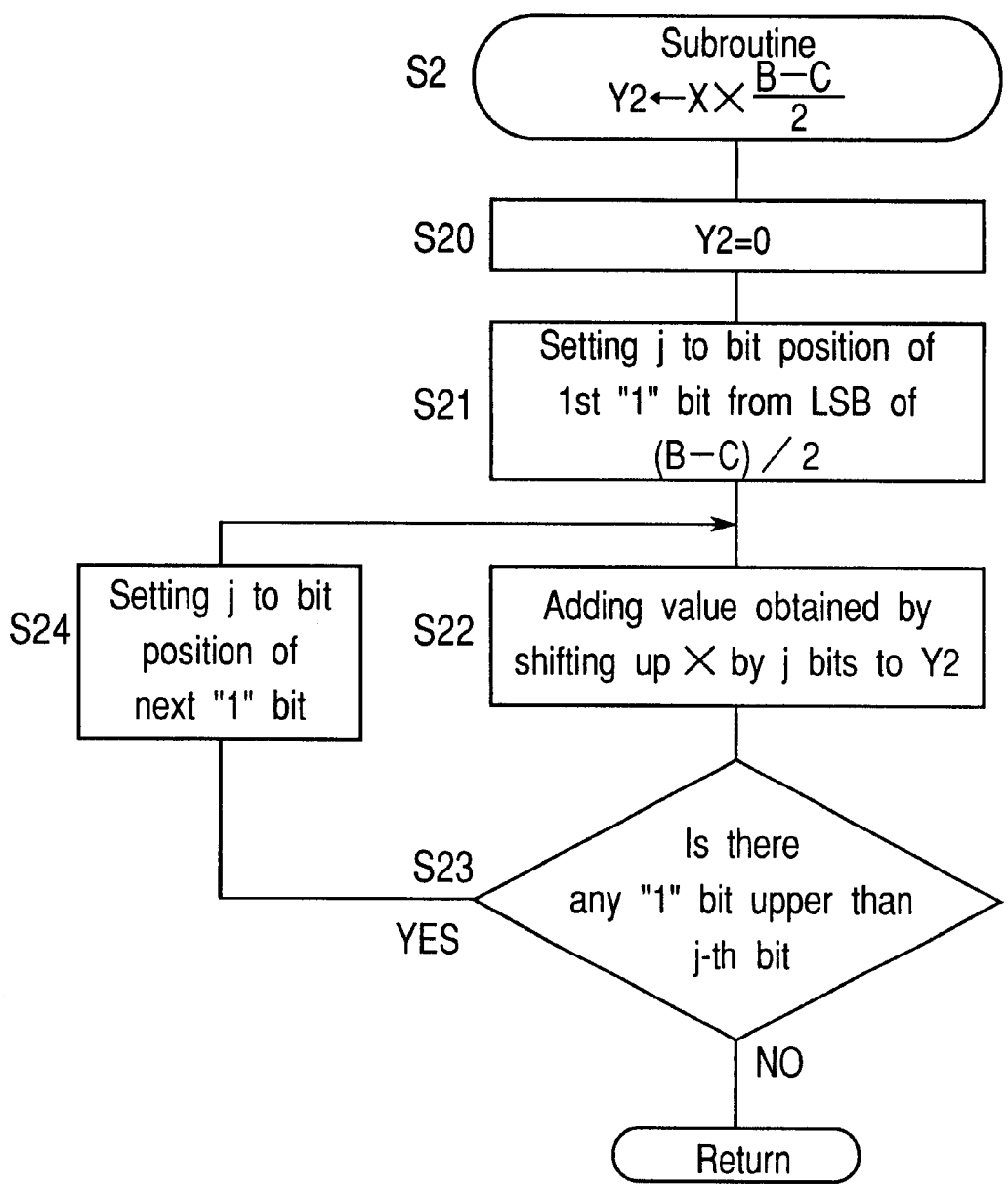
FIG. 8 is a flow chart showing the sequence of operation performed by a shift register of the multiplication device shown in FIG. 1.

FIG. 8 is a flow chart of the process for multiplying the multiplicand X and the remainder coefficient (B−C)/2 which is performed at step S2 in FIG. 6.

This multiplication process starts by initializing the value of the remainder coefficient product Y2 to 0 (step S20). A variable j is then initialized to the bit position of the first "1" bit from the LSB of the remainder coefficient (B−C)/2 (step S21). The value of the multiplicand X shifted up j bits is then added to the remainder coefficient product Y2 (step S22). Decision step S23 then determines if there is a "1" bit at any bit position above bit j from the LSB of the remainder coefficient (B−C)/2. If this decision step S23 returns yes, the variable j is reset to the bit position of that "1" bit (step S24), and the procedure loops back to S22. This loop repeats until there are no more "1" bits above bit j from the LSB of the remainder coefficient (B−C)/2 (step S23=no), and the procedure then returns to the main process.

Embodiment 2

The multiplication device 200 according to a second embodiment of the present invention will now be described with reference to FIG. 9. The multiplication device 200 differs from the multiplication device 100 according to the above first embodiment of the invention in substituting a converter 12 for the subtracter 5 of the multiplication device 100. This converter 12 converts the arithmetic sum calculated by the shift register 11 to a negative value. The selection control signal in this case causes the selector 13 to select either the sum output from the shift register 11 or the negative of the sum, and the output of the multiplication device 200 is thus the sum of the product from the multiplier 10 and the value passed to the adder 14 by the selector 13.

Figure 9:
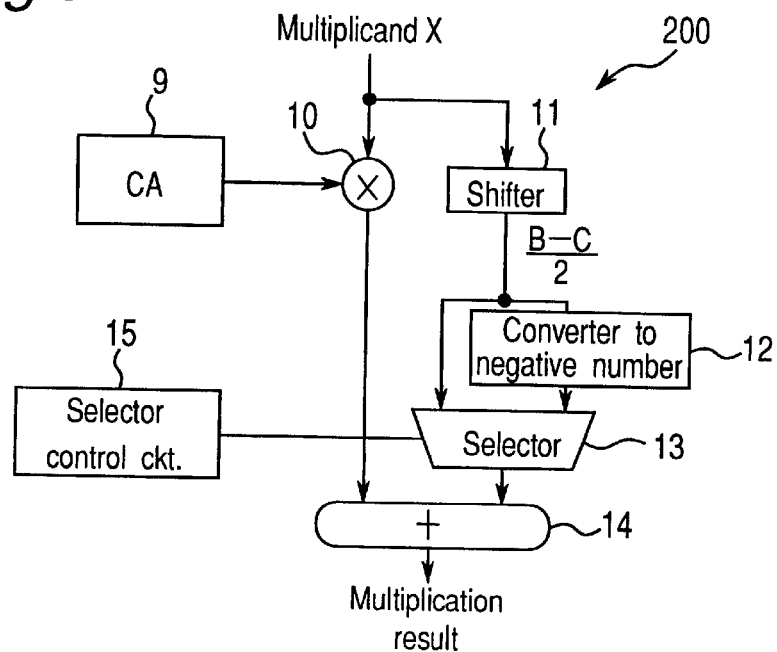
FIG. 9 shows the configuration of the multiplication device according to a second embodiment of the present invention.

Referring to FIG. 9, an average common coefficient CA output circuit 9 calculates the average of the fixed coefficients C1 and C2, that is, calculates (1+C2)/2, and supplies the result (=10000110) to a multiplier 10 as the average common coefficient CA.

It will be further obvious to one with ordinary skill in the art that instead of calculating the average common coefficient CA using this average common coefficient CA output circuit 9, the average CA can be supplied directly from some external source to the multiplier 10, or the average CA can be obtained by software-implemented operation and supplied to the multiplier 10.

The multiplier 10 then multiplies the multiplicand X and the average common coefficient CA, and outputs the product as the intermediate product Y1 to adder 14. Note that the configuration and operation of this multiplier 10 are identical to those of the multiplier 2 of the multiplication device 100 shown in FIG. 3 and described hereinbefore.

A shift register 11 multiplies multiplicand X and remainder coefficient (B−C)/2 and then supplies the product as remainder coefficient product Y2 to the converter 12 and the selector 13. It should be further noted that this shift register 11 is identical to the shift register 3 of the multiplication device 100 as shown in FIG. 5, and thus has a significantly simpler construction than the multiplier 10.

The negative converter 12 converts binary bit data input from the shift register 11 to the complement of 2, that is, to a negative number, and outputs to the selector 13. Note that the "complement of 2" here refers to an inversion of the bit data plus 1.

The selector control circuit 15 outputs a specific selection control signal corresponding to the value of the fixed coefficient to be used. The selector 13 selects either the value from the shift register 11 or the negative of that value biased on the selection control signal from the selector control circuit 15, and then applies the selected value to the adder 14.

The adder 14 subsequently obtains the sum of the intermediate product Y1 from the multiplier 10 and the value passed from the selector 13 as the product obtained by the multiplication device 200.

It will thus be obvious that when compared with a multiplication device in which two multipliers identical to the multiplier 10 of this multiplication device 200 are used to multiply the multiplicand X with these two fixed coefficients C1 and C2, one multiplier multiplying the multiplicand X and one fixed coefficient C1, and another multiplier multiplying the multiplicand X and a second fixed coefficient C2, the multiplication device 200 that uses one multiplier 10 and one simple shift register 11 to accomplish the same task is smaller in scale and can be made more cheaply.

Embodiment 3

A fixed coefficient type FIR digital filter 300 according to a third embodiment of the present invention is described next below with reference to FIG. 10.

A digital filter 300 according to this preferred embodiment comprises ci plurality of multiplication devices each identical to the multiplication device 100 according to the first embodiment of the invention. This digital filter 300 also comprises, for the remainder coefficient data of these plural multiplication devices, a shift register 21 (see FIG. 10) for multiplying multiplicand X and the bit data common to two or more remainder coefficients, and a shift register 22 (see FIG. 10) for multiplying the multiplicand X and the bit data obtained by subtracting the common bit data from a remainder coefficient.

The output of this digital filter 300 is the total of the products obtained for the multiplicand X and the preselected fixed coefficient by the first to third multiplication units as described below.

Figure 10:
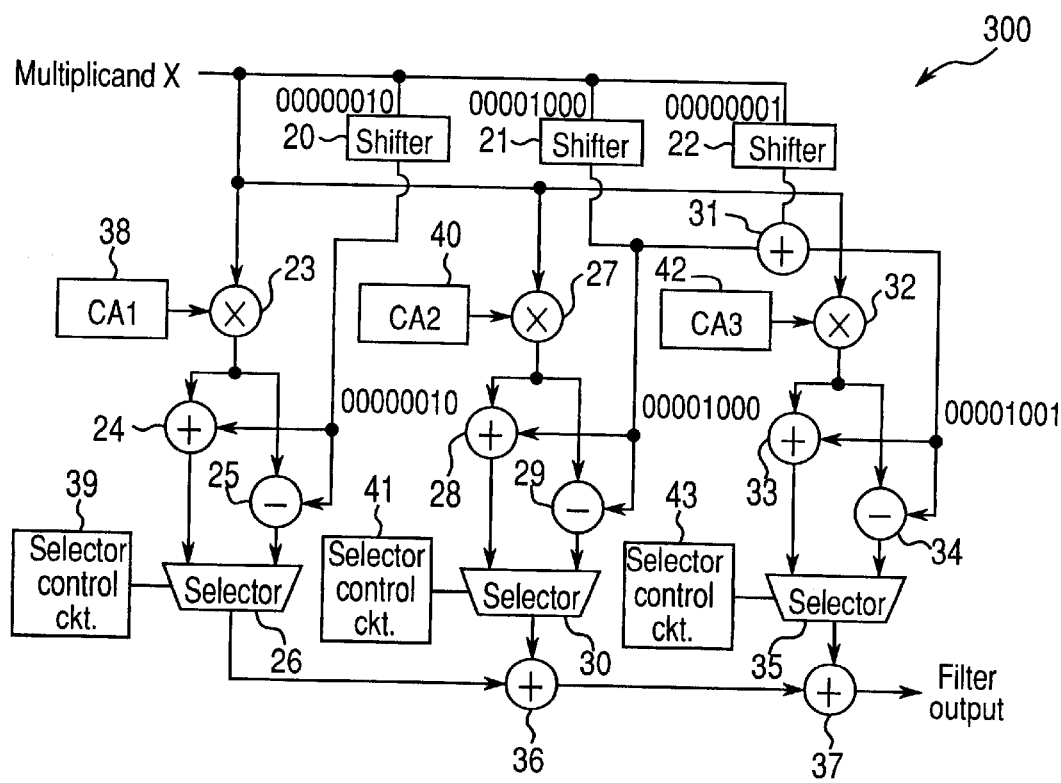
FIG. 10 shows the configuration of a digital filter according to a third embodiment of the present invention.
Figure 11:
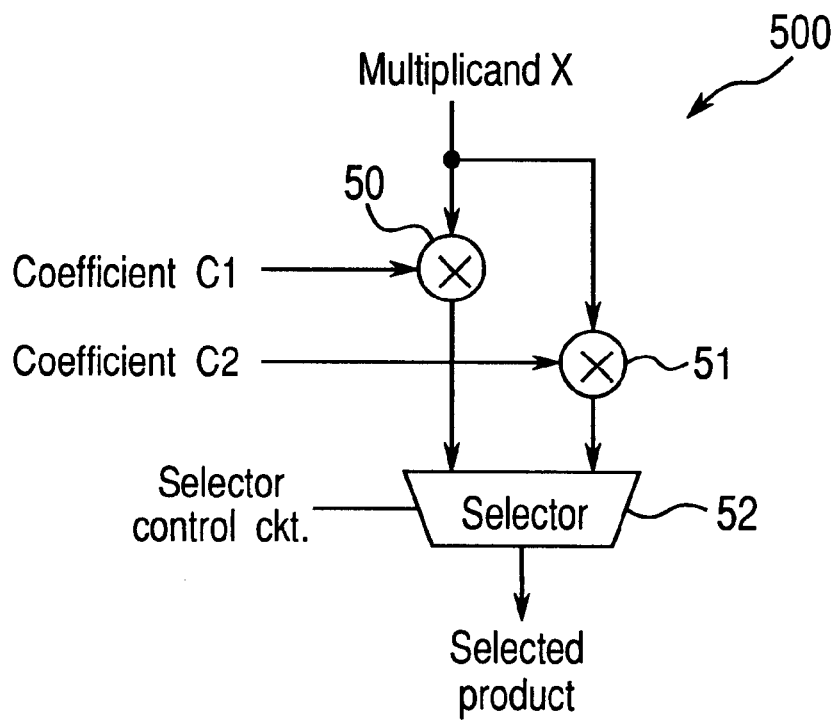
FIG. 11 shows the configuration of the prior art multiplication device.

FIG. 10 is a typical diagram of the fixed coefficient FIR digital filter 300 according to this third embodiment of the present invention. As will be known from FIG. 10, this digital filter 300 comprises: a first multiplication unit comprising a shift register 20, multiplier 23, adder 24, subtracter 25, selector 26, average common coefficient CA1 output circuit 38, and selector control circuit 39; a second multiplication unit comprising a shift register 21, multiplier 27, adder 28, Subtracter 29, selector 30, average common coefficient CA2 output circuit 40, ind selector control circuit 41; and a third multiplication unit comprising shift registers 21 and 22, multiplier 32, adder 31, subtracter 34, selector 35, average common coefficient CA3 output circuit 42, and selector control circuit 43.

It should be noted that while each of the first through third multiplication units of the present embodiment is described as having a structure identical with the multiplication device 100 according to the first embodiment of the invention, it will be obvious that the multiplication device 200 according to the second embodiment of the invention can be alternatively used therefor.

As also shown in FIG. 10, the remainder coefficient of the first multiplication unit is 00000010, the remainder coefficient of the second multiplication unit is 00001000, and the remainder coefficient of the third multiplication unit is 00001001. If a shift register for performing a multiplication operation is provided for the remainder coefficients processed by the first through third multiplication units, a redundant 3 bit shift register for shifting the multiplicand X three bits will be present in the second and third multiplication units.

Noting that the remainder co efficient of the third multiplication unit is effectively 00001000+00000001, the shift register 20 multiplies the multiplicand X and the remainder coefficient 00000010, the shift register 21 multiples the multiplicand X and the remainder coefficient 00001000, and the shift register 22 multiplies the multiplicand X and the remainder coefficient 00000001. That is, shift register 20 is simply a 1 bit shift register for shifting the multiplicand X one bit only, the shift register 21 is a 3 bit shift register for shifting the multiplicand X three bits, and the shift register 22 outputs the multiplicand X with no bit shifting.

In the digital filter 300 so constructed, the first multiplication unit uses the remainder coefficient product from the shift register 20 (the multiplicand X shifted one bit). The second multiplication unit uses the remainder coefficient product from the shift register 21 (the multiplicand X shifted three bits). The third multiplication unit obtains the sum of the remainder coefficients output from the shift register 21 and the shift register 22 (the multiplicand X shifted zero bits and three bits) by means of the adder 31, and uses this sum as the remainder coefficient product.

The selector 26 of the first multiplication unit selects the value from either the adder 24 or the subtracter 25 based on a selection control signal applied from the selector control circuit 39 according to the value of the fixed coefficient to use, and outputs the selected value as the product of the first multiplication unit.

The selector 30 of the second multiplication unit selects the value from either the adder 28 or the subtracter 29 based on a selection control signal applied from the selector control circuit 41 according to the value of the fixed coefficient to use, and outputs the selected value as the product of the second multiplication unit.

The selector 35 of the third multiplication unit selects the value from either the adder 33 or the subtracter 34 based on a selection control signal applied from the selector control circuit 43 according to the value of the fixed coefficient to use, and outputs the selected value as the product of the third multiplication unit.

An adder 36 adds the value passed by the selector 26 and the value passed by selector the 30, and passes the resulting sum to the next adder 37. The adder 37 adds the sum from the adder 36 and the value passed from the selector 35, and passes the resulting sum as the filter output from the digital filter 300.

When the above described circuit structure is employed, a shift register for shifting the multiplicand X three bits can be prevented from being redundantly present in the shift register 21 of the second multiplication unit and the shift register 22 of the third multiplication unit. As a result, the total number of shift registers included in shift registers 20 to 22 can be reduced, thereby simplifying and reducing the cost of the digital filter 300.

It will also be obvious to one with ordinary skill in the related art that these first to third multiplication units can be implemented by means of a computer-executable software based on the flow charts shown in FIG. 6, FIG. 7, and FIG. 8, and moreover, that the digital filter 300 itself can also be implemented by means of a computer-executable software.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A multiplication device for multiplying a multiplicand and first and second fixed coefficients, and outputting a product obtained for a selected one of the first and second fixed coefficients, said multiplication device comprising:

a multiplier for multiplying the multiplicand and an average of the first and second fixed coefficients;

a shift register unit comprising one or more shift registers for shifting the multiplicand up according to a position of each "1" bit in a remainder coefficient, which is obtained by subtracting the average of the fixed coefficients from the first fixed coefficient assuming that the first fixed coefficient is larger than the second one, and an adder for obtaining an arithmetic sum of bit shifted data output from the one or more shift registers; and a selection means for selecting one of the first and second fixed coefficient based on a specific control signal, and said selection means, when the first fixed coefficient is selected, outputting a sum of the product from the multiplier and the arithmetic sum obtained by the shift register unit, but when the second fixed coefficient is selected, outputting a difference of the product from the multiplier minus the arithmetic sum obtained by said shift register unit.

2. The multiplication device as set forth in claim 1, wherein said multiplier comprises:

one or more shift registers for shifting the multiplicand up according to a position of each "1" bit in the average of the fixed coefficients, and an adder for obtaining a sum of shifted data output from said one or more shift registers.

3. The multiplication device as set forth in claim 1, wherein said selection means comprises an adder for obtaining a sum of the product from said multiplier and the arithmetic sum from said shift register, a subtractor for subtracting the arithmetic sum from said shift register from the product from said multiplier, and a selector for selecting one of outputs from said adder and subtractor in response to a selection control signal applied to said selector to output the selected one as a multiplication result.

4. The multiplication device as set forth in claim 3, wherein said multiplier comprises one or more shift registers for shifting the multiplicand up according to a position of each "1" bit in the average of the fixed coefficients, and an adder for obtaining a sum of shifted data output from said one or more shift registers.

5. The multiplication device as set forth in claim 1, wherein said selection means comprises a converter for converting an output from said shift register unit into a complement of 2, a selector for selecting one of the output of said shift register unit, and that of said converter in response to a selection control signal applied to said selector, and an adder for obtaining a sum of the products from said multiplier and an output selected by said selector to output the sum as a multiplication result.

6. The multiplication device as set forth in claim 5, wherein said multiplier comprises one or more shift registers for shifting the multiplicand up according to a position of each "1" bit in the average of the fixed coefficients, and an adder for obtaining a sum of shifted data output from said one or more shift register.

7. A fixed coefficient FIR digital filter comprising a plurality of multiplication units connected in parallel to an input of a multiplicand and at least one add for obtaining a sum of outputs from said plurality of multiplication units, each of said plurality of multiplication units comprising:

a multiplier for multiplying the multiplicand and an average of two fixed coefficients different from each other;

a shift register unit comprising one or more shift registers for shifting the multiplicand up according to a position of each "1" bit in a remainder coefficient, which is obtained by subtracting the average from a larger one of the two fixed coefficients, and an adder for obtaining an arithmetic sum of bit shifted data from said one or more shift registers; and a selection means for selectively outputting one of a sum of the product from said multiplier and the arithmetic sum from said shift register unit and a difference of the product from said multiplier minus the arithmetic sum from said shaft register in response to a selector control signal applied to said selection means.

8. The fixed coefficient FIR digital filter as set forth in claim 7 wherein the multiplier of each multiplication unit comprises one or more shift registers for shifting the multiplicand up according to a position of each "1" bit in the average of the fixed coefficients and an adder for obtaining a sum of shifted data output from said one or more shift registers.

9. The fixed coefficient FIR digital filter as set forth in claim 7, wherein the selection means of each multiplication unit comprises an adder for obtaining a sum of the product from said multiplier and the arithmetic sum from said shift register, a subtractor for subtracting the arithmetic sum from said shift register from the product from said multiplier, and a selector for selecting one of outputs from said adder and subtractor in response to a selection control signal applied to said selector to output the selected one as a multiplication result.

10. The fixed coefficient FIR digital filter as set forth in claim 9, wherein the multiplier of each multiplication unit comprises one or more shift registers for shifting the multiplicand up according to a position of each "1" bit in the average of the fixed coefficients and an adder for obtaining a sum of shifted data output from said one or more shift registers.

11. The fixed coefficient FIR digital filter as set forth in claim 7, wherein the selection means of each multiplication unit comprises a converter for converting an output from said shift register unit into a complement of 2, a selector for selecting one of the output of said shift register unit and that of said converter in response to a selection control signal applied to said selector, and an adder for obtaining a sum of the product from said multiplier and an output selected by said selector to output the sum as a multiplication result.

12. The fixed coefficient FIR digital filter as set forth in claim 11, wherein the multiplier of each multiplication unit comprises one or more shift registers for shifting the multiplicand up according to a position of each "1" bit in the average of the fixed coefficients and an adder for obtaining a sum of shifted data output from said one or more shift registers.

13. The fixed coefficient FIR digital filter as set forth in claim 7, wherein, if a position of a "1" bit in bit data common to two or more remainder coefficients of said plurality of multiplication units, the shift register unit corresponding to said position of a "1" bit is used in common to two or more multiplication units.

* * * * *